(12) United States Patent
Li

(10) Patent No.: US 9,907,162 B2
(45) Date of Patent: Feb. 27, 2018

(54) DISPLAY SUBSTRATE, DISPLAY PANEL AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventor: Kun Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 66 days.

(21) Appl. No.: 14/914,157

(22) PCT Filed: Aug. 21, 2015

(86) PCT No.: PCT/CN2015/087770
§ 371 (c)(1),
(2) Date: Feb. 24, 2016

(87) PCT Pub. No.: WO2016/110105
PCT Pub. Date: Jul. 14, 2016

(65) Prior Publication Data
US 2016/0360607 A1    Dec. 8, 2016

(30) Foreign Application Priority Data

Jan. 6, 2015 (CN) .......................... 2015 1 0006289

(51) Int. Cl.
*H05K 1/02*     (2006.01)
*G02F 1/1333*   (2006.01)
*G02F 1/1345*   (2006.01)

(52) U.S. Cl.
CPC ......... *H05K 1/028* (2013.01); *G02F 1/13454* (2013.01); *G02F 1/133305* (2013.01);
(Continued)

(58) Field of Classification Search
CPC ......... H05K 1/028; H05K 2201/10128; H05K 1/0281; G02F 1/13454; G02F 1/133305; G02F 2001/133388
See application file for complete search history.

(56) References Cited

U.S. PATENT DOCUMENTS

2004/0183959 A1    9/2004 Ishida
2005/0156840 A1*   7/2005 Kim ..................... G09G 3/3655
                                                                345/87
(Continued)

FOREIGN PATENT DOCUMENTS

CN    1532608 A    9/2004
CN    1690780 A    11/2005
(Continued)

OTHER PUBLICATIONS

International Search Report and Written Opinion dated Nov. 26, 2015; PCT/CN2015/087770.
(Continued)

*Primary Examiner* — Hoa C Nguyen
(74) *Attorney, Agent, or Firm* — Ladas & Parry LLP

(57) ABSTRACT

A display substrate, a display panel and a display device are disclosed. The display substrate including a flexible base substrate, the flexible base substrate includes a display area and a non-display area disposed outside the display area, the non-display area of the base substrate is divided to form at least one carrying unit by at least one buffer member, and the problems that flexible display devices cannot display properly and the product yield is affected because integrated circuit is separated from the display substrate when a flexible display substrate in a flexible display device is bended can be resolved.

19 Claims, 6 Drawing Sheets

(52) U.S. Cl.
CPC ............ *G02F 2001/133388* (2013.01); *H05K 1/0281* (2013.01); *H05K 2201/10128* (2013.01)

(56) References Cited

U.S. PATENT DOCUMENTS

| | | | |
|---|---|---|---|
| 2005/0237467 A1* | 10/2005 | Takaishi | G02F 1/13452 349/149 |
| 2010/0073620 A1 | 3/2010 | Yamaguchi et al. | |
| 2012/0161293 A1 | 6/2012 | Burghartz et al. | |
| 2014/0003022 A1 | 1/2014 | Lee | |

FOREIGN PATENT DOCUMENTS

| | | |
|---|---|---|
| CN | 101754576 A | 6/2010 |
| CN | 101833902 A | 9/2010 |
| CN | 102446926 A | 5/2012 |
| CN | 102484106 A | 5/2012 |
| CN | 203812880 A | 9/2014 |
| CN | 104464524 A | 3/2015 |
| KR | 20130022067 A | 3/2013 |
| KR | 20140083252 A | 7/2014 |

OTHER PUBLICATIONS

First Chinese Office Action dated May 9, 2016; Appln. No. 201510006289.2.
Second Chinese Office Action dated Oct. 17, 2016; Appln. No. 201510006289.2.

* cited by examiner

DISPLAY SUBSTRATE, DISPLAY PANEL AND DISPLAY DEVICE

TECHNICAL FIELD

At least one embodiment of the present invention relates to a display substrate, a display panel and a display device.

BACKGROUND

At present, with continual development and progress of technologies and continual increasing of user needs, flexible display devices with flexible plates prepared with a non-rigid material such as plastic have gotten more and more attention because advantages such as convenience to fold or bend, portability for users, and suitability for various display occasions. Studies and investments in this field are increased by display panel manufacturers.

SUMMARY

At least one embodiment of the invention provides a display substrate, a display panel and a display device to solve the problems that flexible display devices cannot display properly and the product yield is affected because integrated circuit is separated from the display substrate when a flexible display substrate in a flexible display device is bended.

At least one embodiment of the invention provides a display substrate comprising a flexible base substrate, the flexible base substrate comprises a display area and a non-display area disposed outside the display area, the non-display area of the base substrate is divided to form at least one carrying unit by at least one buffer member.

At least one embodiment of the invention provides a display panel comprising the display substrate provided by the above-mentioned embodiments.

At least one embodiment of the invention provides a display device comprising the display panel provided by the above-mentioned embodiments.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
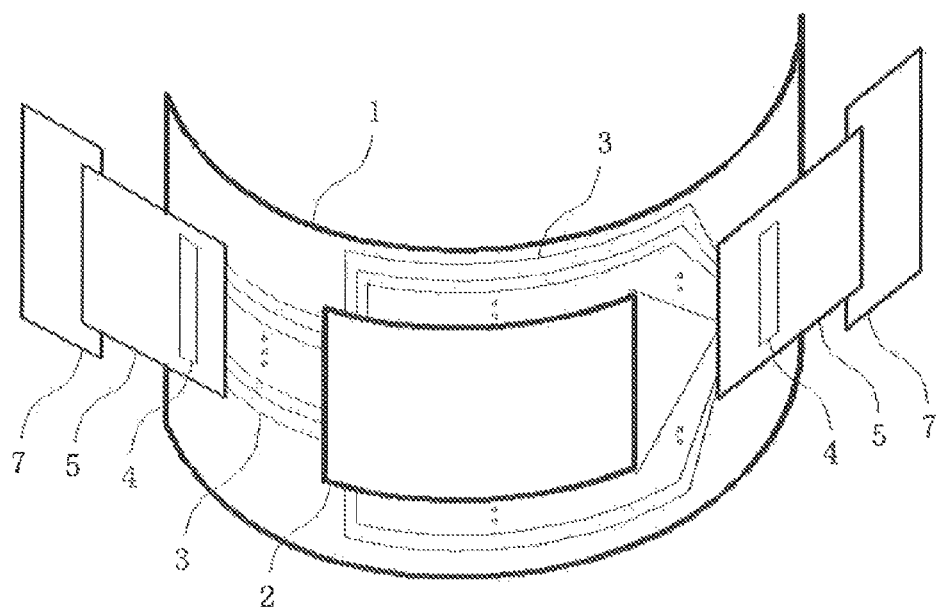
FIG. 1 is a structural schematic view of a display substrate of a flexible display device.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the components or the objects stated before these terms encompass the components or the objects and equivalents thereof listed after these terms, but do not preclude the other components or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In studies, the inventor of the present application has noted that a flexible display device usually comprises a flexible display substrate and display components formed on the flexible display substrate. In order to integrate processes, usually an electronic component of a peripheral circuit is directly, for example by conductive adhesive, adhered to a part of a non-display area of a display substrate, and for example, integrated circuit (IC) is adhered to a part of a non-display area of a display substrate. Because a flexible display substrate is adopted, the whole display panel of a flexible display device can undergo deformation such as bending and folding in a range, and film structures and other components disposed on the display substrate correspondingly undergo deformation such as bending and folding. Because of the limitation on process conditions, at present an IC is usually in a rigid structure and hard to be bent upon a flexible display substrate being bent. When the bending degree of a flexible display substrate goes beyond the threshold of resistance to stress of an adhesive, the adhesive will deform, crack or fall off, and therefore, separation between the above-mentioned rigid IC and the flexible display device is caused, and the flexible display device will not display properly.

Figure 2:
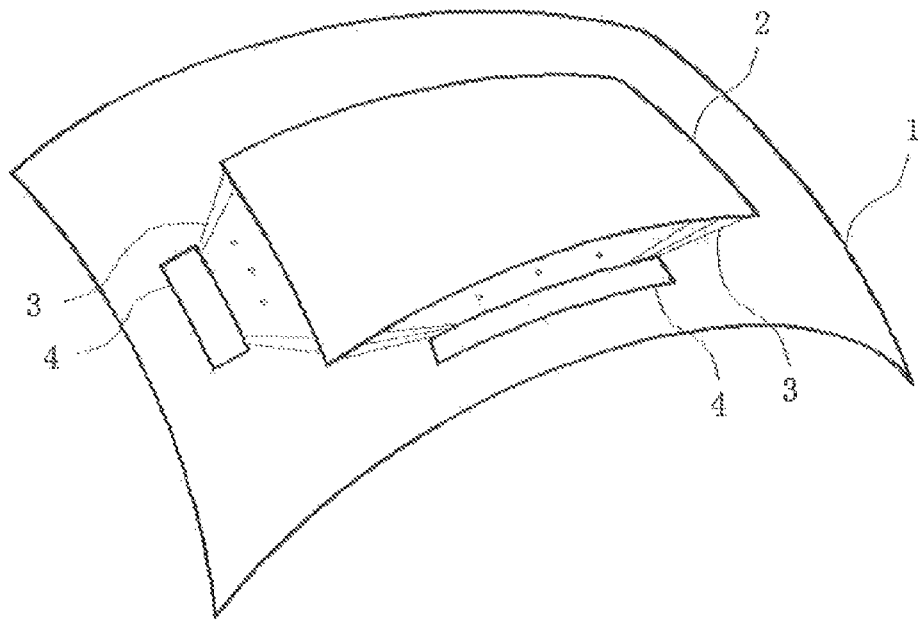
FIG. 2 is a structural schematic view of a display substrate bended multi-axial.
Figure 3:
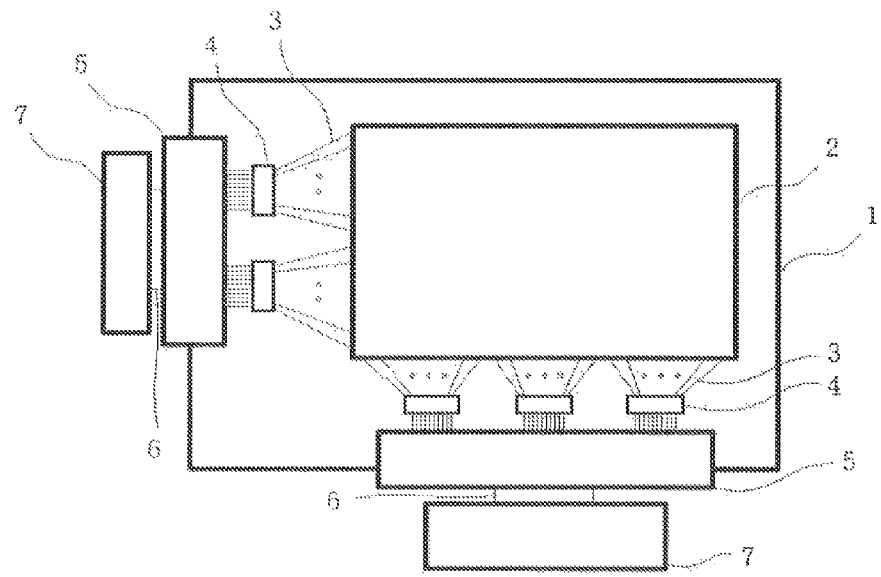
FIG. 3 is a distribution schematic view of ICs on a display substrate.

In order to solve the above-mentioned problems, an IC is usually disposed at a non-bending side of a flexible base substrate, so as to avoid an IC disposed at a bending side of a base substrate from being separated from the base substrate caused by the bending stress when a display panel is bending. As shown in FIG. 1, a display substrate comprises a base substrate 1, the base substrate I is divided into a display area 2 and a non-display area (not shown) outside the display area 2, an IC 4 is disposed at a non-bending side of the non-display area, the IC 4 is on one hand connected to a printed circuit board (PCB) 7 through a flexible printed circuit board (FPC) 5 and on the other hand connected to a display component (not shown) in the display area 2 through a signal line 3. However, this solution is only suitable in a manufacturing process for a flexible display unit bended in a single axis, and it can not be applied to the case of being in more axes. For example, in a partial structural schematic view of a flexible display device as shown in FIG. 2 (meanings of reference numerals are the same as those of FIG. 1), because non-display areas at each side of a base substrate 1 are all in a bending state, the flat area for disposing an IC 4 cannot be guaranteed. Moreover, as shown in FIG. 3, in preparation of a large size display panel, with increase of the display panel size and the improvement of resolution, by considering the limitations in the IC preparation and assembling process, a plurality of ICs disposed side by side are adopted to respectively drive and control the corresponding portion of the components in the display area at the same time to display a whole image. A plurality of ICs 4 are disposed in the non-display area, a portion of the ICs 4 are connected to a PCB 7 through an FPC 5 and a connector 6 at the same time. If a non-bending side solution of a flexible display device as shown in FIG. 1 is adopted, ICs 4 are bond collectively on the non-bending side, which is much difficult.

At least one embodiment of the invention provides a display substrate, a display panel and a display device, to solve the problems that flexible display devices cannot display properly and the product yield is disadvantageously affected because integrated circuit is separated from the display substrate when a flexible display substrate in a flexible display device is bended.

Figure 4A:
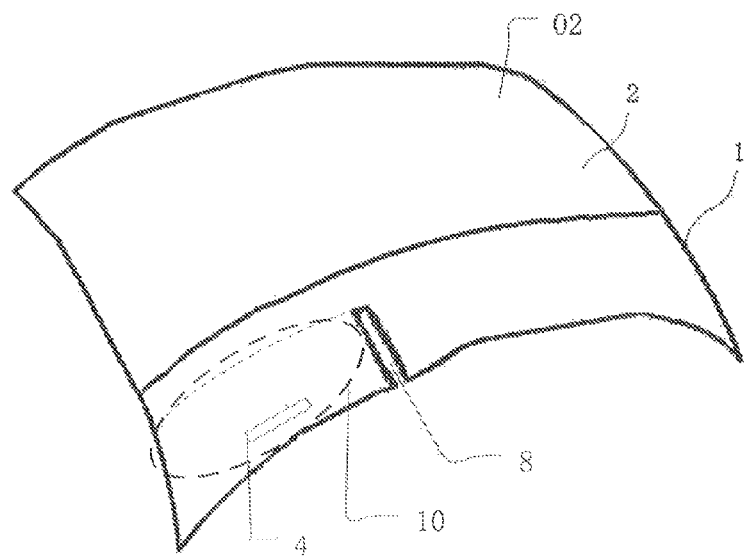
FIG. 4a is a simplified structural schematic view of a optional display substrate provided by an embodiment of the invention.
Figure 4B:
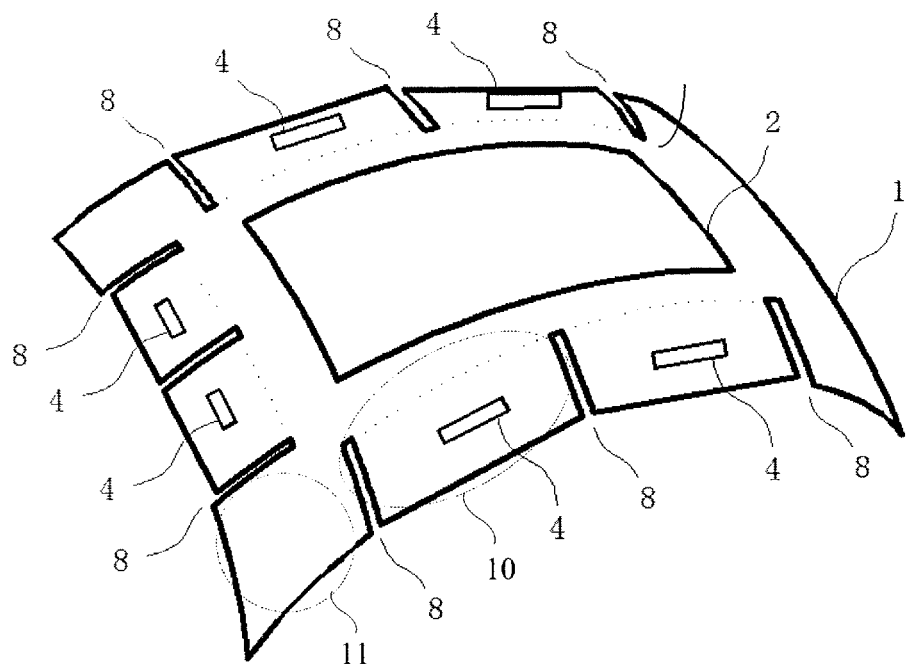
FIG. 4b is a simplified structural schematic view of another optional display substrate provided by an embodiment of the invention.

Referring to FIG. 4a and FIG. 4b, at least one embodiment of the invention provides a display substrate comprising a flexible base substrate 1, the base substrate 1 comprises a display area 2 and a non-display area 02 disposed outside the display area 2, the non-display area 02 of the base substrate 1 is divided to form at least one carrying unit 10 by at least one buffer member 8.

It is to be noted that, a non-display area 02 disposed outside a display area 2 means a non-display area 02 can dispose at least a side of a display area 2, for example, a non-display area 02 can dispose at one side of a display area 2 (as shown in FIG. 4a), or, for example, a non-display area 02 can surround a display area 2 (as shown in FIG. 4b). Moreover, although in FIG. 4a a non-display area 02 is divided into two parts by a buffer member 8, only one of the two parts can be configured as a carrying unit 10.

For example, the amount of the carrying unit 10 can be plural.

For example, the amount of the buffer member 8 can be plural, as shown in FIG. 4b.

For example, at least one electronic component 4 can be disposed on each carrying unit 10. For example, the electronic component 4 can comprise an integrated circuit (IC for short), that is, at least one integrated circuit can be disposed on each carrying unit 10. Of course, the embodiments of the present invention are not limited thereto. The electronic component 4 can also comprise other rigid components.

In the embodiments of the invention, by dividing a non-display area of a base substrate 1 of a display substrate to form at least one carrying unit 10 which is independent, so that when the display substrate is bended, stress is buffered between the carrying substrate 10 and the other part of the base substrate 1 or between carrying units 10 by a buffer member 8, and therefore, the electronic component (for example IC) 4 distributed on each carrying unit 10 will not be separated from the display substrate.

For example, at least one buffer member 8 can be disposed between two adjacent carrying units 10. That is, two adjacent carrying units 10 can be divided by one buffer member 8, or by more (two or more than two) buffer members 8 in different positions. Therefore, in the non-display area, different positions of the base substrate 1 can be divided into carrying units 10 suitable for disposing electronic components (for example IC) 4. In the case that two adjacent carrying units 10 are divided by more buffer members 8 in different positions, for example, an ineffective member 11 can be disposed between two carrying units 10 carrying electronic components (for example IC) 4. Therefore, two buffer members 8 can be disposed between two adjacent carrying units 10. Of course, according to specific design, more buffer members 8 can be disposed between two adjacent carrying units 10, and the redundant portions will be omitted here. That is, in the embodiments of the invention, the buffer member can be disposed freely as needed, so that carrying units in different positions will be obtained.

Figure 5:
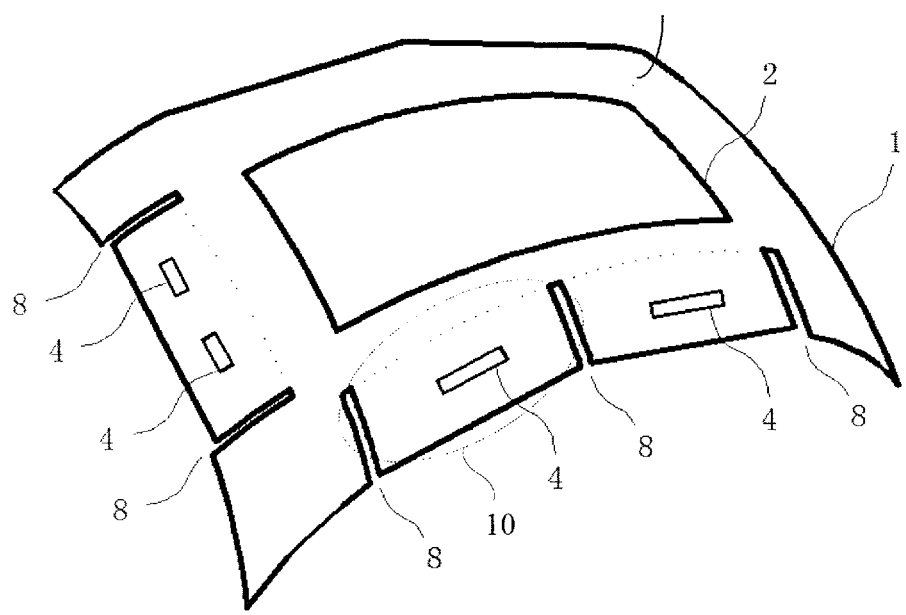
FIG. 5 is a simplified structural schematic view of still another optional display substrate provided by an embodiment of the invention.

According to practical design, for example, a buffer member 8 can be disposed in a non-display area disposed at least one side of the display area 2 of the base substrate 1, that is, can be disposed at least one side of the display area 2, so that carrying units 10 can surround the display area 2, or only located at least one side of the display area 2, for example, located at one side of left side, right side, upside or downside or any combination thereof. For example, as shown in FIG. 4b, all non-display area of the base substrate 1 is divided into a plurality of carrying units 10 by buffer members 8. The base substrate in display area 2 is surrounded by the plurality of carrying units 10. For another example, as shown in FIG. 5, only the left side and the downside of the base substrate 1 is divided into a plurality of carrying units 10 by buffer members 8.

The distribution of the carrying units 10 depends on the specific distribution of the electronic components (for example IC) 4 or the situation of the display substrate being bent. Each relatively independent carrying unit 10 in a certain extent is asynchronous with the bending deformation of the display area 2 of the base substrate 1. That is, when the display substrate is bended and deformed, each carrying unit 10 is further away from the centre of the base substrate 1, and its degree of freedom become bigger, so that the carrying unit 10 and the display area 2 of the base substrate 1 have different deformation curvature (buckling rate), and too much deformation stress will not occur between electronic component (for example IC) 4 on each carrying unit 10 and the display substrate. Therefore, the disconnection of the electronic component (for example IC) 4 will be avoided.

Figure 6:
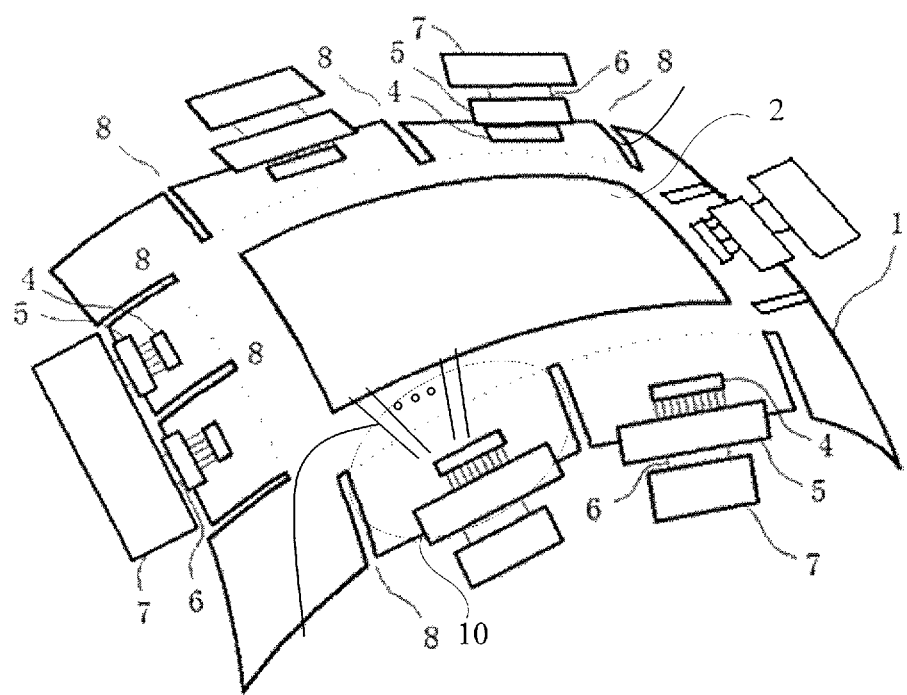
FIG. 6 is a structural schematic view of a first specific display substrate provided by an embodiment of the invention.

For example, a structural schematic view of a first specific display substrate is shown in FIG. 6, the display substrate comprises a base substrate 1, carrying units 10 divided by buffer members 8 are formed at all sides of the non-display area 02 outside the display area 2 of the base substrate 1, an electronic component (for example IC) 4 is disposed on each carrying unit 10, each of the electronic components (for example IC) 4 is on one hand connected to a PCB 7 through an FPC 5 and a connector 6, and on the other hand is connected to a display circuit (not shown in FIG. 6) of the display area 2 through signal lines 3 (only shown signal lines connected to one electronic component in FIG. 6).

Figure 7:
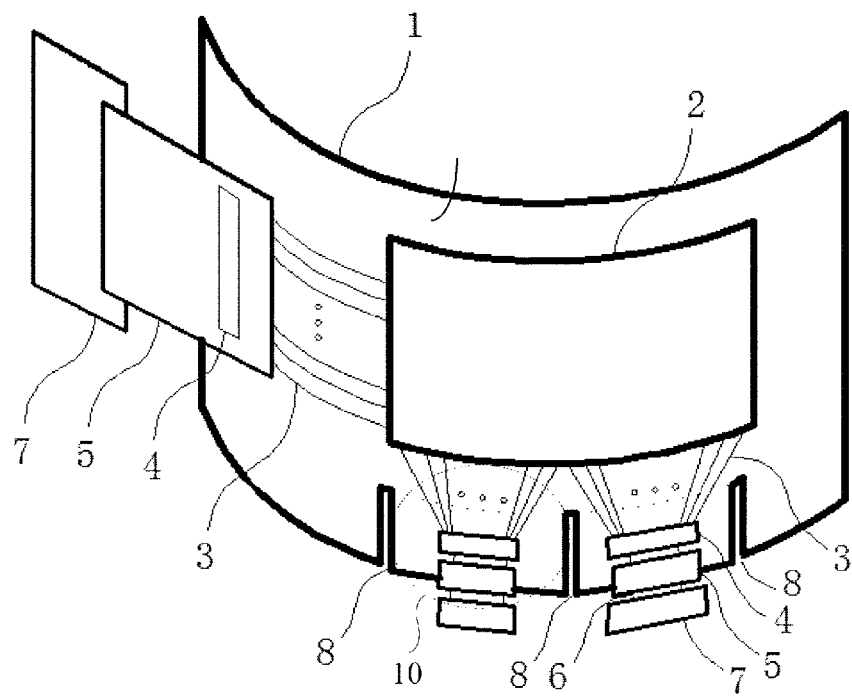
FIG. 7 is a structural schematic view of a second specific display substrate provided by an embodiment of the invention.

For example, a structural schematic view of a second specific display substrate is shown in FIG. 7. The display substrate comprises a base substrate 1, carrying units 10 divided by buffer members 8 are formed at the downside of the non-display area outside the display area 2 of the base substrate 1. An electronic component (IC) 4 is disposed on each carrying unit 10. There is no carrying unit 10 at the left side of the non-display area outside the display area 2 of the base substrate 1 because the area cannot be bended. Each electronic component (for example IC) 4 is on one hand connected to a PCB 7 through an FPC 5 and a connector 6, and on the other hand is connected to a display circuit of the display area 2 through signal lines 3.

Figure 8:
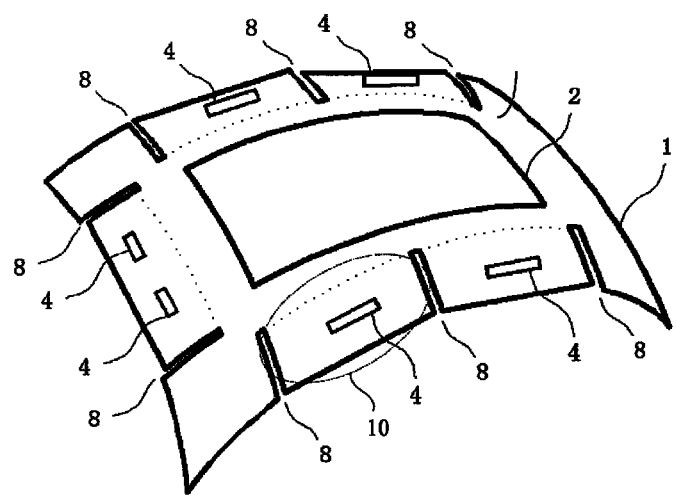
FIG. 8 is a simplified structural schematic view of another optional display substrate provided by an embodiment of the invention.

In FIG. 4a and FIG. 4b, only one electronic component (for example IC) 4 is disposed on each carrying unit 10, and this manner is suitable for the case that the amount of the electronic component 4 is less and the distribution is sparser, by this way the number of the buffer member(s) 8 can be increased, so that the buffer to deformation stress can be improved when the display substrate is bended. Of course, it can also be as shown in FIG. 8 (meanings of reference numerals of FIG. 8 are the same as those of FIG. 4a and FIG. 4b), a plurality of electronic components (for example IC) 4 can be disposed on each carrying unit 10, for example two ICs 4, three ICs 4 or more ICs 4, and this manner is suitable for the case that the amount of the electronic components 4 is big and the distribution is denser, to avoid the situation that the formation area is too smaller or the strength of the base substrate 1 is reduced by carrying units 10 so that the strength of the display substrate is reduced.

In order to prepare easily and guarantee the strength of the buffer members 8, for example, the shape of the buffer member 8 in the plane of the base substrate 1 can be rectangular or taper. For example, the shape of the buffer member 8 as shown in FIG. 4a to FIG. 8 is rectangular, the shape of the buffer member 8 as shown in FIG. 9 to FIG. 10 is taper.

The buffer member 8 can be realized by several manners. For example, the buffer member 8 can be formed as a slit (cut). In embodiments of the invention, the structure of the buffer member with a slit shape is simple and easy to achieve.

For example, a reinforcing member can be disposed for a slit to protect the slit, so that the strength and stability of the slit can be enhanced, and the base substrate is avoided from being torn at the position.

Figure 9:
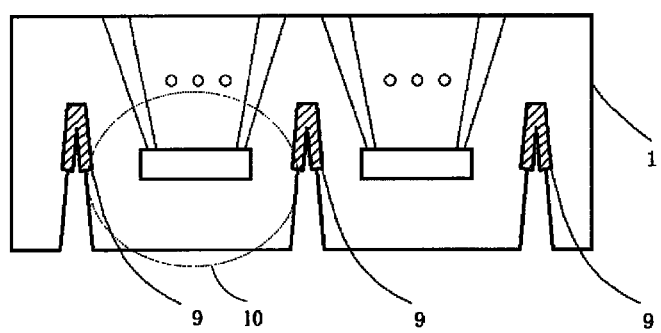
FIG. 9 is a structural schematic view, in which a buffer member is a slit and a first reinforcing member is disposed at the slit, of an embodiment of the invention.
Figure 10:
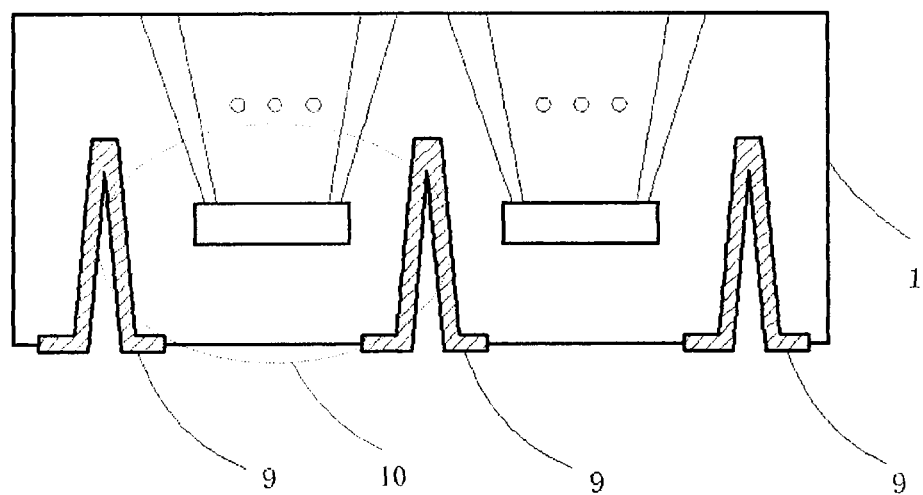
FIG. 10 is a structural schematic view, in which a buffer member is a slit and a second reinforcing member is disposed at the slit, of an embodiment of the invention.

For example, as shown in FIG. 9, a reinforcing member 9 can be only disposed at an edge of the intersection of two carrying units 10 adjacent to the slit. When the display substrate is bended, the intersection of two adjacent carrying units 10 may suffer from stronger deformation stress, the slit is easy to be destroyed, so the strength and stability of the slit can be increased when the protection is provided at the position. Or, for example, as shown in FIG. 10, a reinforcing member 9 can be disposed at all edges of the slit. That is, a complete protection is provided for the slit, and then a more stable slit can be obtained.

Of course, the buffer member 8 can be a groove, that is, the thickness of the designed pattern of the base substrate 1 (that is, the thickness of the position where the buffer member 8 is disposed) becomes thinner to form a groove. The groove is more flexible and ductile, and provides buffer when the base substrate is bended, and redundant description is omitted here. In the embodiments of the invention, the groove as the buffer member 8 is advantageous to guarantee the strength of the base substrate 1.

It is to be noted that, the base substrate 1 is not limited to rectangular provided by the embodiments of the invention, can also be other geometric shapes, for example, the shape of the base substrate 1 is circular, hexagonal or elliptical.

The benefit effects of the embodiments of the invention comprise the follows: by dividing the non-display area of the base substrate to form at least one independent carrying unit, so that when the display substrate is bended, stress is buffered between the carrying unit and the other part of the base substrate or between the carrying units by a buffer member, and therefore, the IC distributed on each carrying unit 10 will not be separated from the display substrate. The configuration is easy to achieve and the product yield of the flexible display device is increased.

At least one embodiment of the invention provides a display panel comprising the display substrate provided by the above-mentioned embodiment. Based on its functions, the display substrate can be applied as a different component of the display panel. For example, with regard to a liquid display panel, the display substrate can be an array substrate, can also be a color filter substrate, or the array substrate and the color filter substrate both adopt the structure of the display substrate provided by the embodiments of the invention. For another example, with regard to an organic light emitting diode display panel, the display substrate can be an array substrate, can also be an encapsulation substrate, or the array substrate and the encapsulation substrate both adopt the structure of the display substrate provided by the embodiments of the invention. Of course, with regard to a display substrate with different functions should have the essential components, for example, in the case that a display substrate is as a color substrate, a light-shielding layer, a color filter layer, an alignment layer etc. can be disposed on the display substrate; for another example, in the case that a display substrate is as an array substrate, at least several among thin film transistor (TFT) arrays, data line, gate line, common electrode, pixel electrode, or common electrode line etc. can be disposed on the display substrate, and the redundant description will be omitted here.

The benefit effects of the embodiments of the invention comprises the follows: by dividing the non-display area of the base substrate to form at least one independent carrying unit, so that when the display substrate is bended, stress is buffered between the carrying unit and the other part of the base substrate or between the carrying units by a buffer member, and therefore, the IC distributed on each carrying unit will not be separated from the display substrate. The configuration is easy to achieve and the product yield of the flexible display device is increased.

At least one embodiment of the invention provides a display device comprising the display panel provided by the above-mentioned embodiment.

For example, the display device can comprise any products or components having display function as follows: e-Paper, mobile phone, panel computer, TV set, display apparatus, laptop, digital photo frame, navigation instrument or the like.

The benefit effects of the embodiments of the invention comprises the follows: by dividing the non-display area of the base substrate to form at least one independent carrying unit, so that when the display substrate is bended, stress is buffered between the carrying unit and the other part of the base substrate or between the carrying units by a buffer member, and therefore, the IC distributed on each carrying unit will not be separated from the display substrate. The configuration is easy to achieve and the product yield of the flexible display device is increased.

What are described above is related to the illustrative embodiments of the disclosure only and not limitative to the protecting scope of the invention. The protecting scopes of the invention are defined by the accompanying claims.

This application claims the benefit of priority from Chinese patent application No. 201510006289.2, filed on Jan. 6, 2015, the disclosure of which is incorporated herein in its entirety by reference as a part of the present application.

What is claimed is:

1. A display substrate comprising a flexible base substrate, wherein the flexible base substrate comprises a display area and a non-display area disposed outside the display area, and the non-display area of the base substrate is divided to form at least one carrying unit by at least one buffer member, the buffer member is a slit on an edge of the flexible base substrate, a reinforcing member is disposed at an edge of the slit, and in a plan view of the display substrate, a part of the reinforcing member is disposed in the slit.

2. The display substrate according to claim 1, wherein at least one integrated circuit is disposed on the carrying unit.

3. The display substrate according to claim 1, wherein at least one electronic component is disposed on the carrying unit.

4. The display substrate according to claim 3, wherein the electronic component comprises an integrated circuit.

5. The display substrate according to claim 1, wherein at least one buffer member is disposed between two adjacent carrying units.

6. The display substrate according to claim 5, wherein the buffer member is a slit.

7. The display substrate according to claim 6, wherein the shape of the slit is rectangular or taper.

8. The display substrate according to claim 6, wherein a reinforcing member is disposed at an edge of the slit, and the reinforcing member is only disposed at an edge of the intersection of two adjacent carrying units of the slit; or, the reinforcing member is disposed at all edges of the slit.

9. The display substrate according to claim 5, wherein the shape of the buffer member in the plane of the base substrate is rectangular or taper.

10. The display substrate according to claim 5, wherein the buffer member is a groove.

11. The display substrate according to claim 1, wherein the buffer member is disposed in a non-display area disposed at least one side of the display area of the base substrate.

12. The display substrate according to claim 1, wherein the shape of the slit is rectangular or taper.

13. The display substrate according to claim 12, wherein a reinforcing member is disposed at an edge of the slit, and the reinforcing member is only disposed at an edge of the intersection of two adjacent carrying units of the slit; or, the reinforcing member is disposed at all edges of the slit.

14. The display substrate according to claim 1, wherein the reinforcing member is only disposed at an edge of the intersection of two adjacent carrying units of the slit; or, the reinforcing member is disposed at all edges of the slit.

15. The display substrate according to claim 1, wherein the buffer member is a groove.

16. The display substrate according to claim 15, wherein the shape of the buffer member in the plane of the base substrate is rectangular or taper.

17. The display substrate according to claim 1, wherein the shape of the buffer member in the plane of the base substrate is rectangular or taper.

18. A display panel comprising the display substrate according to claim 1.

19. A display device comprising the display panel according to claim 18.

* * * * *